United States Patent [19]
Pascucci et al.

[11] Patent Number: 5,499,217
[45] Date of Patent: Mar. 12, 1996

[54] BIAS CIRCUIT FOR A MEMORY LINE DECODER DRIVER OF NONVOLATILE MEMORIES

[75] Inventors: Luigi Pascucci; Carla M. Golla, both of Sesto San Giovanni; Marco Maccarrone, Palestro, all of Italy

[73] Assignee: SGS-Thomson Microelectronics S.r.l., Milan, Italy

[21] Appl. No.: 348,461

[22] Filed: Dec. 2, 1994

[30] Foreign Application Priority Data

Dec. 2, 1993 [EP] European Pat. Off. ............ 93830489

[51] Int. Cl.$^6$ .................................................... G11C 8/00
[52] U.S. Cl. .......................... 365/230.06; 365/189.11; 365/189.09
[58] Field of Search ......................... 365/230.06, 233.5, 365/189.11, 189.09, 189.05

*Primary Examiner*—Joseph A. Popek
*Attorney, Agent, or Firm*—David V. Carlson; Patrick McBride; Seed and Berry

[57] ABSTRACT

A memory line decoding driver is so biased that the P channel pull-up transistor biasing the final inverter conducts a high current during the line address transient phase, for rapidly charging the input of the final inverter, and is turned on weakly during the static phase between one address phase and another, for reducing current consumption. For which purpose, a voltage modulating stage alternatively connects the gate terminal of the pull-up transistor to a capacitor, with which the charge is distributed, and to the supply.

23 Claims, 2 Drawing Sheets

BIAS CIRCUIT FOR A MEMORY LINE DECODER DRIVER OF NONVOLATILE MEMORIES

TECHNICAL FIELD

The present invention relates to a memory line decoder driver for nonvolatile memories, memory line here meaning a row or column of a nonvolatile memory.

BACKGROUND OF THE INVENTION

As is known by those skilled in the art, memory line decoder drivers provide for driving associated rows or columns on the basis of a selection signal and address signals by which the associated row or column address is coded.

Like other nonvolatile memory components, memory line decoder drivers present conflicting requirements of low current consumption and high reading speed. This is because the speed at which the rows and columns in a memory are addressed (and hence the speed of the reading phase) increases with increases in the current charging the row or column capacitance, thus resulting in increased current consumption.

The following description applies to both row and column decoder drivers, but for simplicity reference will be made to a row decoder driver only. To enable a clearer understanding of the problem the invention addresses, a description will first be given of a typical row decoder driver arrangement as known to those skilled in the art, with reference to FIG. 1 in which the driver is indicated as a whole by 1.

As shown in FIG. 1, driver 1 comprises a NAND circuit 2 with three inputs for coding the address of the row to be addressed (signals A, B and C); a selection transistor 3 interposed between the output of NAND circuit 2 and a node 4, and the gate terminal of which is supplied with a selection signal Pi; a final inverter 5 with its input connected to node 4 and its output 7 connected to the word line WL associated with the driven row; and a P channel pull-up transistor 6 interposed between a supply line VPC and node 4, and the gate terminal of which is supplied with a voltage control signal V1.

In the FIG. 1 circuit, pull-up transistor 6 is required to maintain the input of final inverter 5 biased when selection signal Pi is maintained low to deselect the group of rows addressed by Pi (the same selection signal Pi is also supplied to other rows, typically sixteen in all). When selection signal Pi is switched to low, selection transistor 3 is disabled, and, in the absence of a pull-up transistor, would leave the input of final inverter 5 floating. Pull-up transistor 6 provides for connecting node 4 to supply line VPC, thereby biasing the input of final inverter 5.

Pull-up transistor 6 is driven in two ways presently known in the art. In a first known solution as shown in FIG. 1, signal V1 is such as to keep pull-up transistor 6 always on. In a second known solution as shown in FIG. 2, signal V1 switches according to whether the associated row is selected or deselected, and more specifically turns off pull-up transistor 6 if the associated row is selected.

In FIG. 2 (in which the same parts as in FIG. 1 are indicated using the same numbering system), the gate terminal of pull-up transistor 6 is connected to the output of an inverter 10, the input of which is connected to node 4.

Both the solutions described above present drawbacks. Both solutions have zero current consumption under static conditions at the end of the address switching transient when signals A, B and C are high but the associated row is not selected by signal Pi becoming high. However, both signals behave differently at the end of the row selection transient when signals A, B and C and selection signal Pi are all high. Then, first solution presents a current path between pull-up transistor 6 (on), selection transistor 3 and the N channel transistors (not shown) typically forming NAND circuit 2; which current path, in view of the large size of the driver components for ensuring fast operation, results in more than negligible current consumption.

In the second solution (FIG. 2 circuit) on the other hand, following the row selection transient (node 4 low), pull-up transistor 6 is turned off so that current consumption is zero under static conditions. The second solution, however, requires the use of a carefully designed feedback circuit which can present operating problems in the event of a wide variation in the supply voltage of driver 1 and involves a complex layout.

Therefore, there is a need in the art for a decoder driver bias circuit designed to overcome the drawbacks of known solutions, and which in particular is such as to provide the low current consumption of the decoder driver under static conditions, and high-speed switching during the selection transient.

SUMMARY OF THE INVENTION

According to the present invention, there is provided a bias circuit for a memory line decoder driver of nonvolatile memories, as claimed in the claims.

In practice, according to the present invention, the bias voltage of the pull-up transistor is so modulated as to be reduced during address selection, so as to achieve high conduction of the pull-up transistor and rapidly charge the inputs of the final inverters of the rows to be deselected; and is maintained at a higher level under static conditions, so as to keep the pull-up transistor turned on weakly and so minimize current consumption of the driver of the selected rows.

BRIEF DESCRIPTION OF THE DRAWINGS

A preferred, non-limiting embodiment of the present invention will be described by way of example with reference to the accompanying drawings, in which.

DETAILED DESCRIPTION OF THE INVENTION

Figure 3:
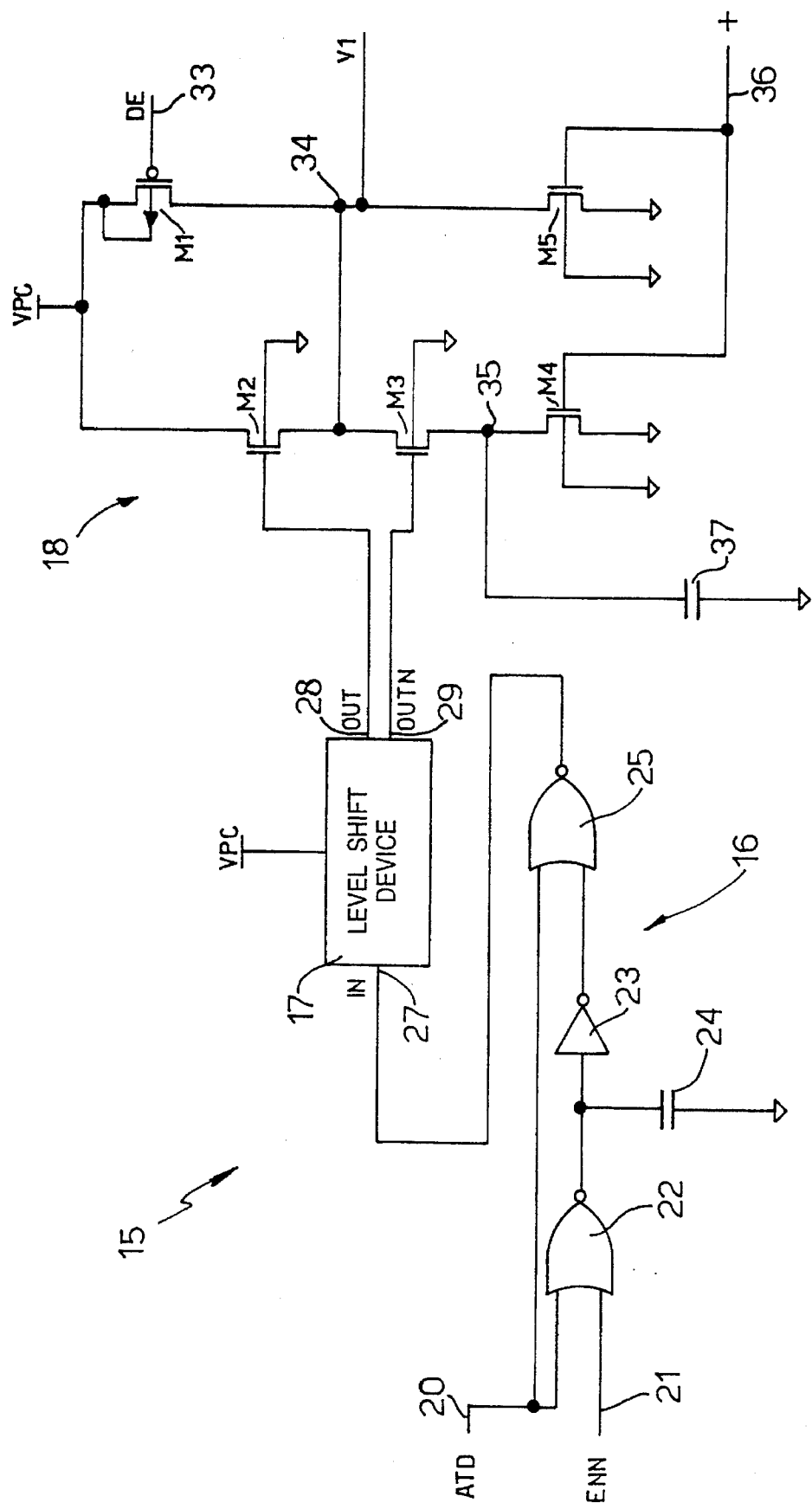
FIG. 3 shows the bias circuit according to an embodiment of the present invention.

In FIG. 3, the bias circuit is indicated as a whole by 15, and substantially comprises a monostable stage 16, a level shift device 17, and a voltage modulating stage 18.

More specifically, monostable stage 16 presents two inputs 20 and 21 supplied respectively with signals ATD and ENN. Signal ATD is a logic signal (see also FIG. 4) which switches to high upon switching of the first row address in the memory array (not shown) of which bias circuit 15 and driver 1 form part, and switches back to low upon switching of the last row address. Signal ENN is an inverted enabling signal which only permits operation of bias circuit 15 when low.

Inputs 20 and 21 are connected to a NOR circuit 22, the output of which is connected to the input of an inverter 23 and to a capacitor 24 interposed between the output of the NOR circuit and ground. The output of inverter 23 is connected to one input of a further NOR circuit 25, the second input of which is connected to input 20 of the circuit. The output of NOR circuit 25 (presenting logic signal IN) is connected to input 27 of level shift device 17, which provides for interfacing the logic circuits supplied with voltage $V_{DD}$ (not shown, supplying monostable stage 16) and those of the row driver which are supplied with voltage VPC. Level shift device 17 presents two outputs 28 and 29 respectively presenting an OUT signal and an OUTN signal inverted in relation to OUT. More specifically, the OUT signal is at 0 V (and the OUTN signal at VPC) when the IN signal at input 27 is low; and is at VPC (and the OUTN signal at 0 V) when the IN signal is high, according to the following table:

| IN | OUT | OUTN |
|----|-----|------|
| 0  | 0 V | VPC  |
| 1  | VPC | 1    |

Figure 1:
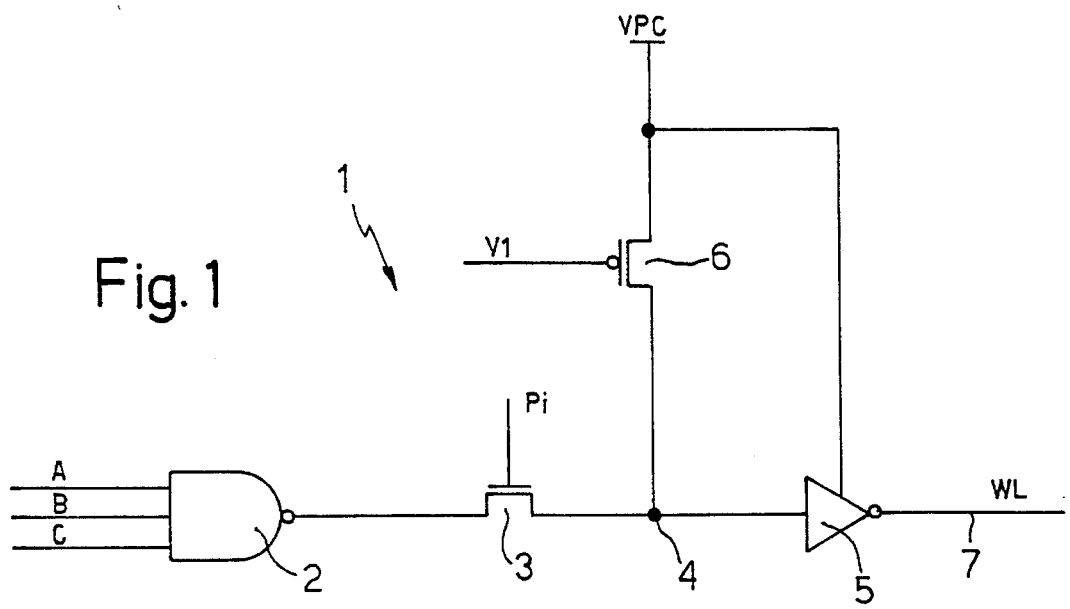
FIG. 1 shows a known type of row decoder driver.

Voltage modulating stage 18 comprises five transistors M1–M5, of which M1 is a P channel transistor, and M2–M5 N channel transistors. More specifically, transistor M1 presents a source terminal connected to supply line VPC; a gate terminal defining input 33 of circuit 15 and supplied with signal DE (for disabling the associated pull-up transistor 6); and a drain terminal connected to the output node 34 of circuit 15 supplying the bias voltage V1 of pull-up transistor 6 of circuit 1 in FIG. 1.

Transistor M2 presents a drain terminal connected to supply line VPC; a gate terminal connected to output 28 of level shift device 17; and a source terminal connected to node 34. Transistor M3 presents a drain terminal connected to node 34; a gate terminal connected to output 29 of level shift device 17; and a source terminal connected to node 35. Transistor M4 presents a drain terminal connected to node 35; a gate terminal connected to a bias line 36 (e.g. 1.9 V); and a grounded source terminal. Transistor M5 presents a drain terminal connected to node 34; a gate terminal connected to bias line 36; and a grounded source terminal.

Transistors M1–M5 are not all the same size. More specifically, M4 and M5 are substantially longer and hence far more resistive as compared with M2 and M3 for the reasons given below.

Voltage modulating stage 18 also comprises a capacitor 37 interposed between node 35 and ground.

The FIG. 3 circuit operates as follows (refer also to FIG. 4).

Figure 4:
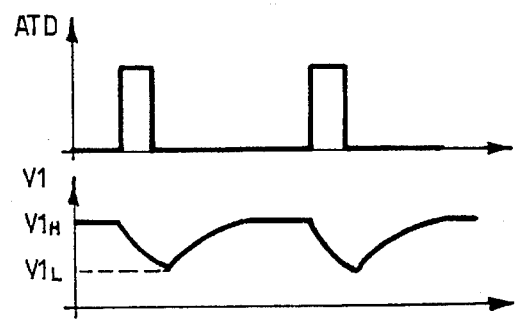
FIG. 4 shows a graph of two quantities in FIG. 3.

Transistors M4 and M5 are always on, and, during normal operation of the circuit, DE is high (so that M1 is off) and ENN is low. Under static conditions, signal ATD is also low, so that the output of NOR circuit 22 is high, the output of inverter 23 is low, IN is high, the OUT signal is at VPC, the OUTN signal is at 0 V, and consequently M2 is on and M3 off. In the above condition, capacitor 37 is short-circuited to ground by M4, and M2, M5 operate as a resistive divider wherein, in view of the difference in size and hence equivalent resistance of the two transistors, node 34 presents a voltage $V1_H$ according to the equation:

$$V1_H = VPC - VT_{M2}$$

where $VT_{M2}$ is the threshold voltage of transistor M2 (see also FIG. 4).

In the above condition, the pull-up transistors 6 connected to bias circuit 15 are turned on weakly, thus minimizing (to about 10 µA) the current consumption of pull-up transistors 6 of the selected rows under static conditions. As regards the deselected rows, pull-up transistors 6 are turned on, albeit weakly, by a sufficient amount to maintain a high bias state at the input of respective final inverters 5 with no current consumption on the part of the pull-up transistors.

When address switching, signal ATD presents a pulse (FIG. 4) which activates monostable stage 16. More specifically, upon signal ATD switching to high, NOR circuit 25 switches, the IN signal switches to low, level shift device 17 switches, the OUT signal switches to low, the OUTN signal switches to high (VPC), so that M2 is turned off and M3 turned on. As node 34 is no longer related to supply line VPC, the charge is distributed between the gate regions of pull-up transistors 6 connected to node 34 and capacitance C1 of capacitor 37 (initially discharged). The circuit is in a condition in which the capacitances of the pull-up transistor gate regions are in series with capacitor 37, via M3, thus forming a capacitance divider (in this phase, M4 and M5 are practically ineffective by virtue of their high equivalent resistance).

As a result, voltage V1 at node 34 falls to a predetermined level according to the equation:

$$V1_L = VPC * C_{pu}/(C_{pu}+C1)$$

where $C_{pu}$ is the capacitance of the gate region of pull-up transistor 6, thus enabling increased current conduction by all the pull-up transistors connected to node 34, for rapidly charging the inputs of final inverters 5.

The monostable stage switches shortly after zero switching of ATD. When ATD switches, capacitor 24 begins charging, at the end of which signal IN switches so as to turn off transistor M3, turn on transistor M2, and so restore the static conditions wherein V1 is restored to $V1_H$, and capacitor 37 discharges groundwards via M4. The delay in the switching of monostable stage 16 in relation to signal ATD provides for ensuring all the inputs of the final inverters of the deselected rows are charged correctly.

Signal DE, which is normally high, provides, when switched to low, for simultaneously turning off all the pull-up transistors connected to node 34 (e.g. when all the word lines in the sector or memory array are addressed, and so eliminating current consumption due to conduction of the pull-up transistors which, albeit low, would be significant over a large number of transistors).

When high, the enabling signal ENN provides for grounding voltage V1, in which case, the IN output of monostable stage 16 is low, outputs OUT and OUTN are respectively low and high, transistor M2 is turned off and M3 turned on, thus resulting in a situation similar to that of the selection transient, except that, in this case, the phase is much longer and hence the effect more noticeable of M4 and M5 which discharge capacitor 37 and the gate capacitance of the pull-up transistors until V1 is zeroed.

The advantages of the circuit according to the present invention will be clear from the foregoing description. Firstly, it provides for increased performance in terms of current consumption and speed. Static current consumption for the selected rows is reduced by the pull-up transistors being turned on only weakly, for which reason it is also possible to make the pull-up transistors smaller as compared with known drivers. In addition to a reduction in area, this therefore provides for a further reduction in current consumption, and with no falloff in speed, in that, by modulating the bias voltage, the pull-up transistors are still capable, during the deselection transients, to conduct a strong current for rapidly charging the inputs of the inverters.

Figure 2:
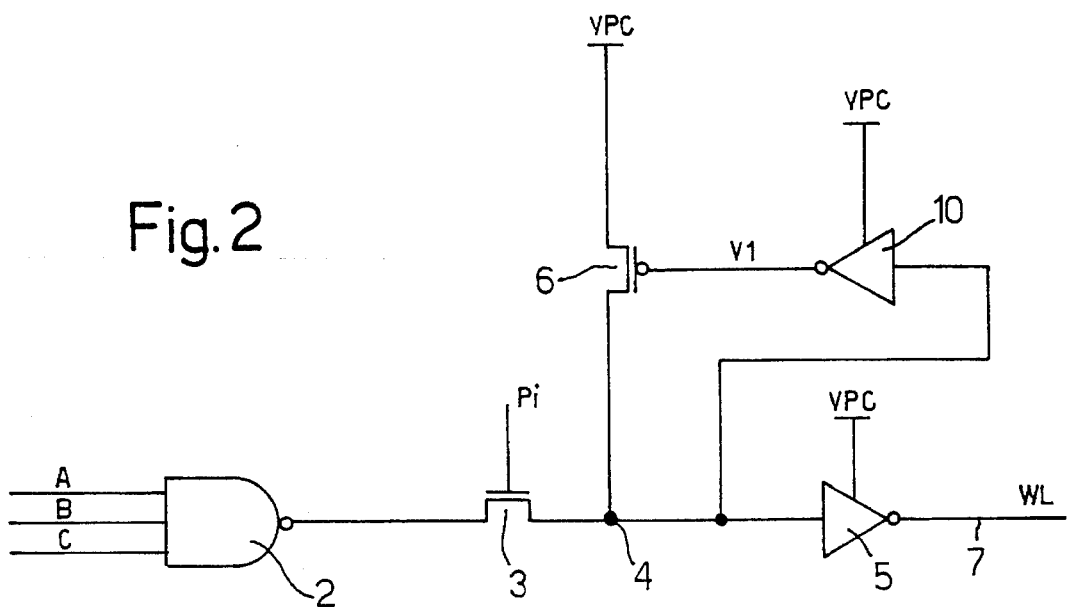
FIG. 2 shows the same driver featuring a known bias circuit.

Secondly, the solution described is straightforward, and may be implemented easily, as a separate circuit for biasing a large number of drivers, with no alteration to the layout of the drivers as required formerly for the FIG. 2 circuit. On the whole, therefore, the layout of the drivers and relative bias circuit is simplified.

Finally, by virtue of the solution described being independent of the row decoder supply voltage, it may also be applied to devices operating within a fairly wide supply voltage range.

To those skilled in the art it will be clear that changes may be made to the circuit as described and illustrated herein without, however, departing from the scope of the present invention. In particular, it may be applied equally as well to column drivers; and the monostable stage and voltage modulator configurations may vary as compared with those illustrated.

We claim:

1. A bias circuit for a memory line decoder driver of nonvolatile memories, wherein said driver comprises final drive means, and pull-up transistor means connected between a first reference potential line and the input of said final drive means; said drive means being designed to switch during transient selection and deselection phases, and to maintain a steady state during static phases interposed between said transient phases; said bias circuit comprising generating means for generating a variable bias signal for said pull-up transistor means; wherein said generating means includes switching means for switching said bias signal between a first level corresponding to a weak turn-on state of said transistor means at least during said static phases, and a second level corresponding to a high turn-on state of said transistor means during said transient deselection phases.

2. A bias circuit as claimed in claim 1, characterized by the fact that the bias circuit further comprises a monostable stage having an input supplied with an address phase signal, and designed to generate a switch signal for said generating means.

3. A bias circuit as claimed in claim 2, characterized by the fact that said monostable stage comprises means for generating a switch signal activated by, and of longer duration than, said address phase signal.

4. A bias circuit as claimed in claim 3, characterized by the fact that said monostable stage comprises logic circuits.

5. A bias circuit as claimed in claim 3, characterized by the fact that said monostable stage presents a second input supplied with an enabling signal for switching said monostable stage and said bias circuit between an enabled state wherein said bias signal switches between said first and second level, and a disabled state wherein said bias signal corresponds to a full-on state of said transistor means.

6. A bias circuit as claimed in claim 2, characterized by the fact that the bias circuit further comprises level shift means interposed between said monostable stage and said generating means.

7. A circuit as claimed in claim 2, characterized by the fact that said switching means comprise first switch means interposed between said first reference potential line and an output node; second switch means interposed between said output node and a signal level switch node, said first and second switch means being push-pull controlled by said switch signal; capacitive means interposed between said signal level switch node and a second reference potential line; and discharge means, interposed between said signal level switch node and said second reference potential line, for connecting said output node to a potential close to said first reference potential line, and said capacitive means to said discharge means, during said static phases, and for connecting said output node to said capacitive means during said transient phases.

8. A circuit as claimed in claim 7, characterized by the fact that said first and second switch means and said discharge means respectively comprise a first, second and third MOS transistor; said third MOS transistor being much longer than said first and second MOS transistors.

9. A circuit as claimed in claim 8, characterized by the fact that said switching means also comprise a fourth MOS transistor interposed between said output node and said second reference potential line; said fourth MOS transistor being much longer than said first and second MOS transistors; said third and fourth MOS transistors having gate terminals connected to a third reference potential line.

10. A circuit as claimed in claim 9, characterized by the fact that said switching means also comprise a fifth MOS transistor interposed between said first reference potential line and said output node.

11. A circuit as claimed in claim 10, characterized by the fact that said first, second, third and fourth MOS transistors are N channel transistors, and said fifth transistor is a P channel transistor.

12. A memory line decoding driver for nonvolatile memories, comprising final drive means, and pull-up transistor means connected between a first reference potential line and the input of said final drive means; said final drive means being designed to switch during transient selection and deselection phases, and to maintain a steady state during static phases interposed between said transient phases; characterized by the fact that the memory line decoding driver further comprises a bias circuit as claimed in claim 1.

13. A method of biasing a memory line decoding driver of nonvolatile memories, said driver comprising final drive means, and pull-up transistor means connected between a first reference potential line and the input of said final drive means; said final drive means being designed to switch during transient selection and deselection phases, and to maintain a steady state during static phases interposed between said transient phases; said method comprising the step of generating a variable bias signal for said pull-up transistor means; characterized by the fact that said generating step comprises the step of switching said bias signal between a first level corresponding to a weak turn-on state of said transistor means at least during said static phases, and a second level corresponding to a high turn-on state of said transistor means during said transient deselection phases.

14. A bias circuit for a memory line decoder driver of nonvolatile memories, wherein the decoder driver comprises a memory word line driver and a switch having a bias input for selectively coupling a supply electric potential to an input of the word line driver, and wherein the bias circuit comprises:

a control input coupled to an address phase signal;

a bias output coupled to the decoder driver switch bias input; and a switch for alternately coupling a high bias electric potential and a threshold bias electric potential to the bias output in response to the address phase signal, wherein the high bias electric potential is sufficient to bias the decoder driver switch substantially beyond its threshold bias and the threshold bias electric potential is sufficient to bias the decoder driver switch substantially at its threshold bias.

15. The bias circuit of claim 14, further comprising:

a monostable input coupled to the address phase signal;

a monostable output coupled to the control input; and a monostable circuit for receiving the address phase signal from the monostable input and outputting a switch signal at the monostable output, wherein the switch signal is sufficient to cause the bias circuit switch to couple the high bias electric potential to the decoder driver switch bias input for a time which is longer than the address phase signal is on.

16. The bias circuit of claim 15, further comprising:

a level shift circuit interposed between the monostable output and the control input, wherein the level shift circuit can receive the switch signal at a first logic electric potential and can couple the switch signal to the control input at a second logic electric potential which is different than the first logic electric potential.

17. The bias circuit of claim 15, wherein the monostable circuit comprises:

a first NOR logic gate having a first input coupled to the monostable input, a second input coupled to an enabling signal, and an output coupled to a delay node;

a second NOR logic gate having a first input coupled to the monostable input, a second input coupled to the output of a logic inverter, and an output coupled to the monostable output;

the logic inverter, having an input coupled to the delay node; and a capacitor having a first terminal coupled to the delay node and a second terminal coupled to ground.

18. The bias circuit of claim 14, wherein the bias circuit switch comprises:

a fifth switch for selectively coupling the supply electric potential to the bias output;

a first switch for selectively coupling the supply electric potential to the bias output;

a second switch for selectively coupling the bias output to a capacitive discharge node;

a third switch for selectively coupling the capacitive discharge node to ground;

a fourth switch for selectively coupling the bias output to ground; and an electric potential storage device for selectively coupling the capacitive discharge node to ground; and the control input comprises:

a first control input of the first switch for operating the first switch to couple the supply electric potential to the bias output;

a second control input of the second switch for operating the second switch to couple the bias output to the capacitive discharge node.

19. The bias circuit of claim 18, wherein:

the fifth switch is a PMOS transistor;

the first and second switches are first and second NMOS transistors, respectively;

the third and fourth switches are third and fourth NMOS transistors, respectively, having greater static resistances than the first and second NMOS transistors;

the electric potential storage device is a capacitor;

the first switch first control input is the gate of the first NMOS transistor; and the second switch second control input is the gate of the second NMOS transistor.

20. A method of biasing a memory line decoder driver of nonvolatile memories, comprising the steps of:

receiving an address phase signal;

providing a switch signal which is a function of the address phase signal;

alternately outputting a high bias electric potential and a threshold bias electric potential in response to the switch signal, wherein the high bias electric potential is sufficient to bias the decoder driver substantially beyond its threshold bias and the threshold bias electric potential is sufficient to bias the decoder driver substantially at its threshold bias.

21. The method of claim 20, wherein:

the switch signal is sufficient to cause the high bias electric potential to be output for a time which is longer than the address phase signal is on.

22. The method of claim 20, wherein:

the address phase signal is received at a first logic electric potential; and the switch signal is provided at a second logic electric potential, wherein the second logic electric potential is different than the first logic electric potential.

23. A nonvolatile memory system comprising:

a memory device;

a memory line decoder driver including a memory word line driver and a switch having a bias input for selectively coupling a supply electric potential to an input of the word line driver; and a bias circuit including:

a control input coupled to an address phase signal;

a bias output coupled to the decoder driver switch bias input; and a switch for alternately coupling a high bias electric potential and a threshold bias electric potential to the bias output in response to the address phase signal wherein the high bias electric potential is sufficient to bias the decoder driver switch substantially beyond its threshold bias and the threshold bias electric potential is sufficient to bias the decoder driver switch substantially at its threshold bias.

\* \* \* \* \*